(12) United States Patent
Chu

(10) Patent No.: US 7,598,530 B2
(45) Date of Patent: Oct. 6, 2009

(54) LIGHT EMITTING DIODE WITH HIGH ILLUMINATION

(75) Inventor: Yuan-Fa Chu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/051,685

(22) Filed: Mar. 19, 2008

(65) Prior Publication Data

US 2008/0296595 A1  Dec. 4, 2008

(30) Foreign Application Priority Data

Jun. 1, 2007  (CN)  ............ 200710074802

(51) Int. Cl.
*H01L 29/201*  (2006.01)
(52) U.S. Cl. ............... 257/90; 257/88; 257/94; 257/E33.068; 257/E33.044; 438/22; 438/29; 438/46
(58) Field of Classification Search ........... 257/88–103, 257/E33.068, E33.044; 438/22, 29, 46
See application file for complete search history.

(56) References Cited

U.S. PATENT DOCUMENTS 5,869,849 A  2/1999  Jou et al.

| | | | |
|---|---|---|---|
| 2004/0124428 A1* | 7/2004 | Lin et al. | 257/90 |
| 2004/0135166 A1* | 7/2004 | Yamada et al. | 257/103 |
| 2005/0062049 A1* | 3/2005 | Lin et al. | 257/79 |
| 2007/0290221 A1* | 12/2007 | Tsai et al. | 257/99 |

* cited by examiner

*Primary Examiner*—Cuong Q Nguyen
*Assistant Examiner*—Cathy N Lam
(74) *Attorney, Agent, or Firm*—Andrew C. Cheng

(57) ABSTRACT

A light emitting diode (80) includes a first and a second semiconductor structures (30, 40), and an adhesive layer (34, 46) between the first and the second semiconductor structures. The first semiconductor structure includes a n-type AlGaInP cladding layer (13), a p-type AlGaInP cladding layer (17), an AlGaInP active layer (15) between the n-type and the p-type AlGaInP cladding layers, a transparent conducting layer (62) on the n-type AlGaInP cladding layer, a first electrical contact (82) on the transparent conducting layer, ohmic electrodes (21) ohmic contact the p-type AlGaInP cladding layer, and a reflecting layer (32) on an opposite side of the p-type AlGaInP cladding layer to the AlGaInP active layer. The second semiconductor structure includes a carrier substrate (42), an ohmic contact layer (44) on the carrier substrate, and a second electrical contact (74) on an opposite side of the carrier substrate to the ohmic contact layer.

10 Claims, 13 Drawing Sheets

LIGHT EMITTING DIODE WITH HIGH ILLUMINATION

BACKGROUND

1. Technical Field

The present invention generally relates to structures of light emitting diodes.

2. Description of Related Art

Light emitting diodes (LEDs) are a type of semiconductor light source that are widely used in electrical products such as scientific instruments, medical instruments, or electronic consumer products, due to their high brightness, long lifespan, and wide color gamut. However, the electrical resistivity of a p-type cladding layer of LEDs is comparatively high, resulting in electric current supplied to the LEDs not being uniformly distributed over the p-type cladding layer in a lateral direction and flowing toward an active light emitting layer located below the p-type cladding layer. This is often referred to as current crowding. Current crowding induces light emitted from different areas of the LED having different illuminations which decreases light emitting efficiency of the LED.

Referring to U.S. Pat. No. 5,869,849, an LED which has a decreased current crowding problem is provided. The LED is provided by steps of: i) forming a double hetero-structure of AlGaInP, which includes a p-type AlGaInP cladding layer, an active AlGaInP layer and an n-type AlGaInP cladding layer, on a GaAs substrate; ii) bonding an n-type GaP layer to the double hetero-structure of AlGaInP by a wafer bonding technique, and removing the GaAs substrate from the double hetero-structure of AlGaInP; (iii) sequentially forming a p-type GaAs ohmic contact layer and an indium tin oxide (ITO) current spreading layer on the p-type AlGaInP cladding layer; and iv) respectively forming a first electrical contact on the n-type GaP layer and a second electrical contact on the indium tin oxide current spreading layer.

In the forgoing LED of U.S. Pat. No. 5,869,849, the GaAs substrate, which is an opaque substrate, is replaced by the n-type GaP layer which serves as a transparent window layer of the LED. The light generated by the double hetero-structure of AlGaInP is emitted via the window layer. The n-type GaP layer has good electrical conductivity which decreases current crowding of the LED, and the electric current is dispersed by the indium tin oxide current spreading layer which further decreases current crowding of the LED.

However, in the forgoing LED of U.S. Pat. No. 5,869,849, the GaP layer and the double hetero-structure of AlGaInP are bonded together by directly pressing the GaP layer toward the double hetero-structure of AlGaInP, which causes a bonding force generated between the GaP layer and the double hetero-structure of AlGaInP not adequate enough to fixedly bond the n-type GaP layer with the double hetero-structure of AlGaInP. Therefore, the n-type GaP layer and the double hetero-structure of AlGaInP need to be heated to 650° C. for 30 minutes in the oven so as to fixedly bond the n-type GaP layer with the double hetero-structure of AlGaInP. This will harmfully affect the double hetero-structure of AlGaInP and decrease the yield of the LED.

What is needed, therefore, is a LED which needs not to be heated during manufacturing process and has a high qualifying rate.

SUMMARY

The present invention provides a light emitting diode with high illumination. The light emitting diode includes a first semiconductor structure, a second semiconductor structure and an adhesive layer. The first semiconductor structure includes a n-type AlGaInP cladding layer, a p-type AlGaInP cladding layer, an AlGaInP active layer sandwiched between the n-type AlGaInP cladding layer and the p-type AlGaInP cladding layer, a transparent conducting layer on the n-type AlGaInP cladding layer, a first electrical contact on the transparent conducting layer, a plurality of ohmic electrodes in ohmic contact with the p-type AlGaInP cladding layer, and a reflecting layer formed on an opposite side of the p-type AlGaInP cladding layer to the AlGaInP active layer. The second semiconductor structure includes a carrier substrate, an ohmic contact layer formed on the carrier substrate, and a second electrical contact formed on an opposite side of the carrier substrate to the ohmic contact layer. The adhesive layer is sandwiched between the reflecting layer of the first semiconductor structure and the ohmic contact layer of the second semiconductor structure.

Other advantages and novel features of the present light emitting diode will become more apparent from the following detailed description of preferred embodiments when taken in conjunction with the accompanying drawings, in which:

DETAILED DESCRIPTION

Figure 1:
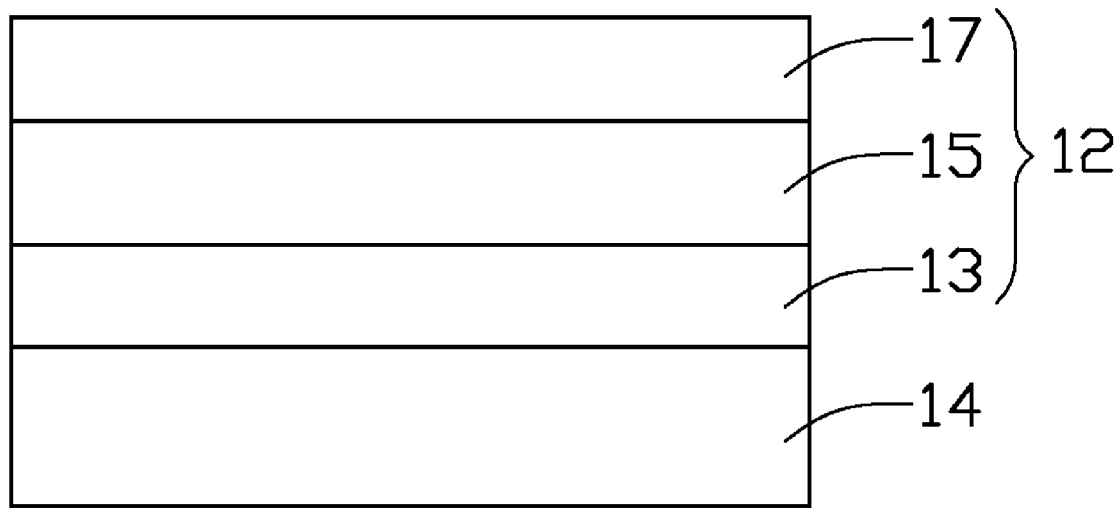
FIG. 1 shows an epitaxy structure of a light emitting diode according to a first embodiment of the present invention, the epitaxy structure includes a n-type GaAs substrate, an n-type AlGaInP cladding layer located on the GaAs substrate, an AlGaInP active layer located on the n-type AlGaInP cladding layer, and a p-type AlGaInP cladding layer located on the AlGaInP active layer.

Reference will now be made to the drawing figures to describe the preferred embodiment in detail.

Figure 6:
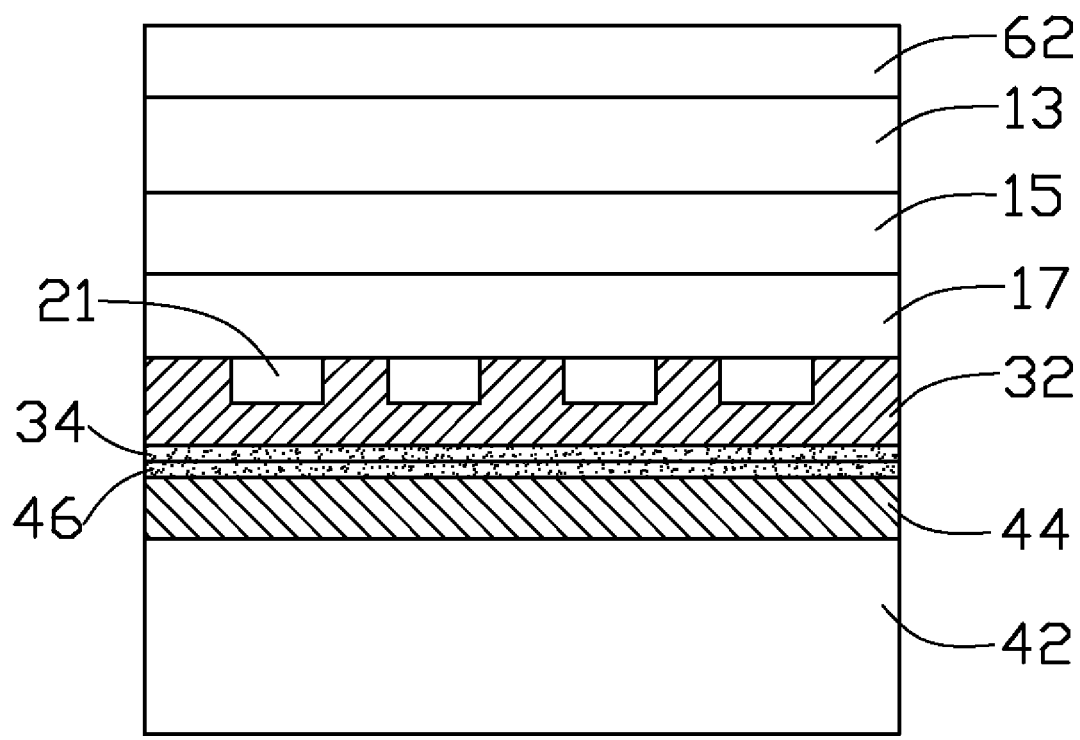
FIG. 6 shows a structure obtained during manufacturing the present light emitting diode, the structure is obtained from forming a transparent conducting layer on the n-type AlGaInP cladding layer of the light-emitting diode chip of FIG. 5.
Figure 7:
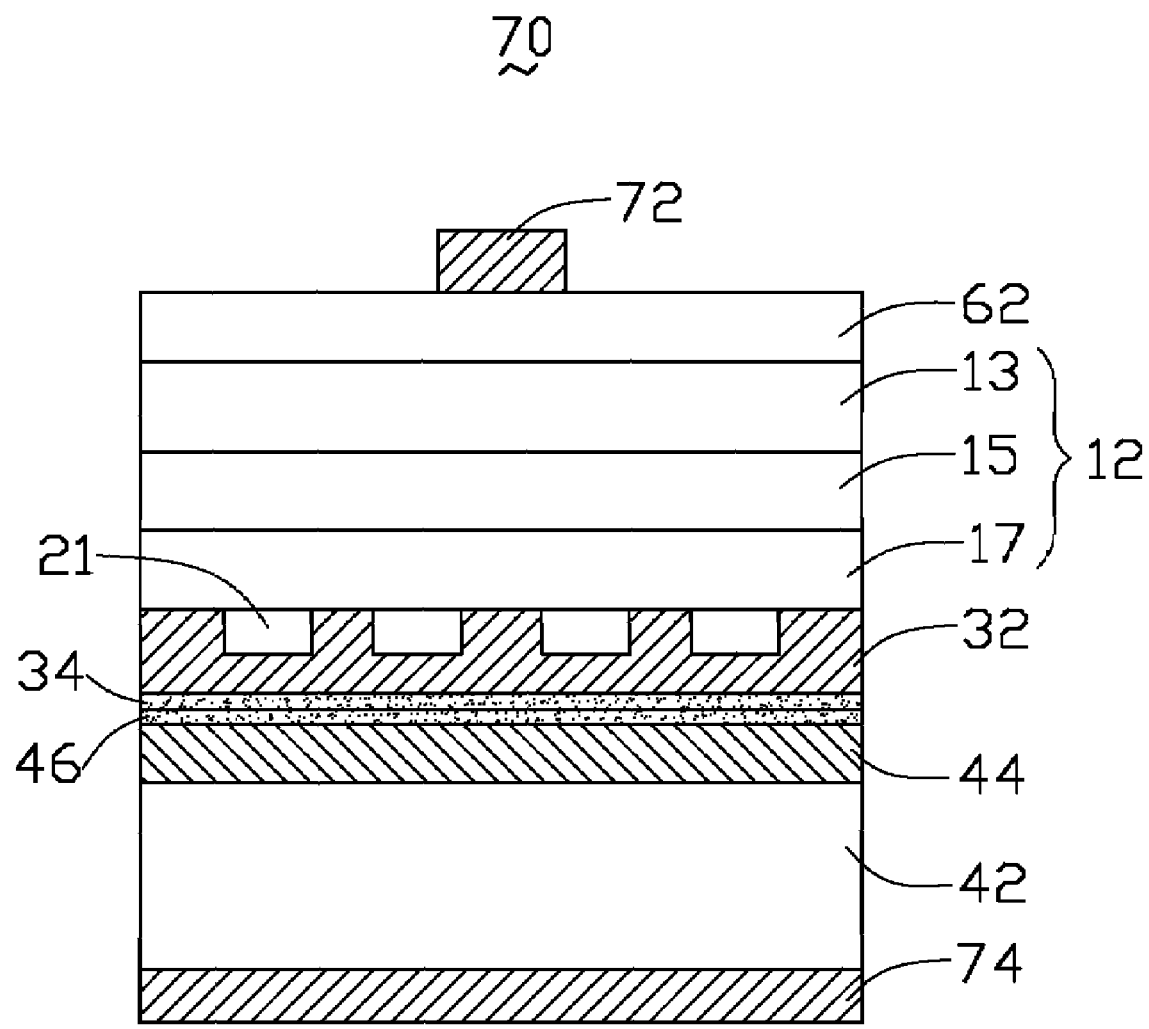
FIG. 7 shows the light emitting diode according to the first embodiment of the present invention, the light emitting diode is obtained from forming a first electrical contact on the transparent conducting layer and forming a second electrical contact on a bottom surface of the carrier substrate.

The present invention provides a light emitting diode 70 (shown in FIG. 7). Referring to FIGS. 1 to 7, the light emitting diode 70 is manufactured by the following steps:

Referring to FIG. 1, an epitaxy structure 10 is shown. The epitaxy structure 10 includes an n-type gallium arsenide (GaAs) substrate 14 and a semiconductor light-emitting structure 12 located on top of the GaAs substrate 14. The semiconductor light-emitting structure 12 is a double heterostructure of AlGaInP which includes a n-type aluminum indium gallium phosphide (AlGaInP) cladding layer 13 located on top of the GaAs substrate 14, an AlGaInP active layer 15 located on top of the n-type AlGaInP cladding layer 13, and a p-type AlGaInP cladding layer 17 located on top of the AlGaInP active layer 15.

Figure 2:
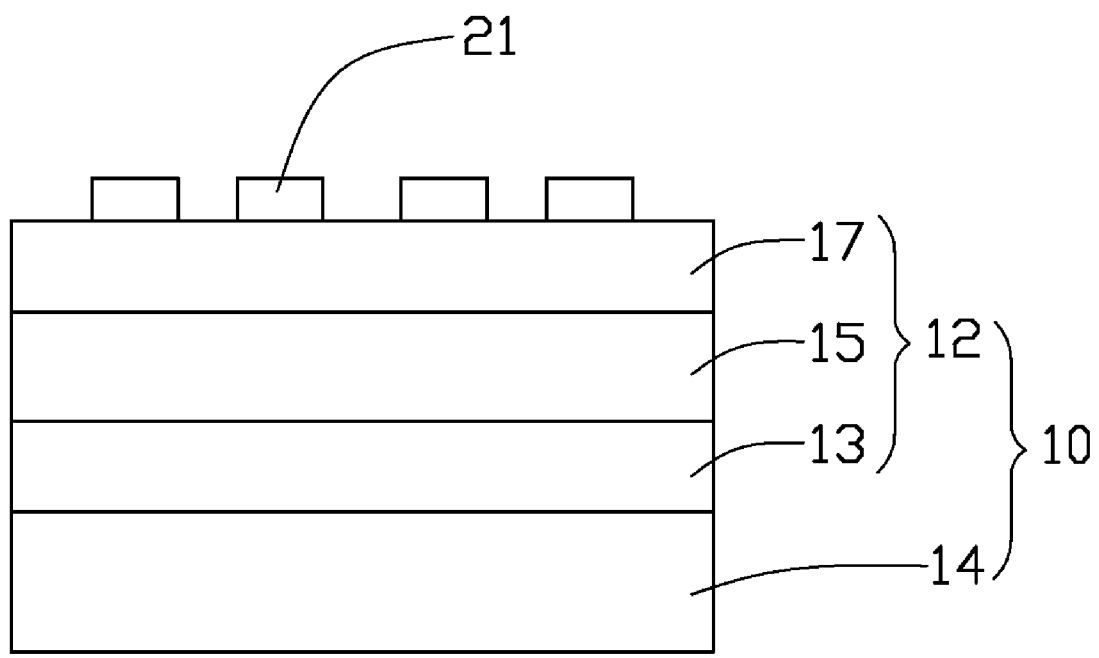
FIG. 2 shows a structure obtained during manufacturing the present light emitting diode, the structure is obtained from forming a plurality of point-like ohmic electrodes on the p-type AlGaInP cladding layer of the epitaxy structure of FIG. 1.

Referring to FIG. 2, a plurality of point-like ohmic electrodes 21 are partially formed on the p-type AlGaInP cladding layer 17 of the epitaxy structure 10. The point-like ohmic electrodes 21 are formed on the epitaxy structure 10 sequentially by mesa etching, metallizing, and thermal treatment processes. The point-like ohmic electrodes 21 are discretely distributed on the p-type AlGaInP cladding layer 17 of the epitaxy structure 10, guiding electric current to uniformly distribute over the epitaxy structure 10.

Figure 3:
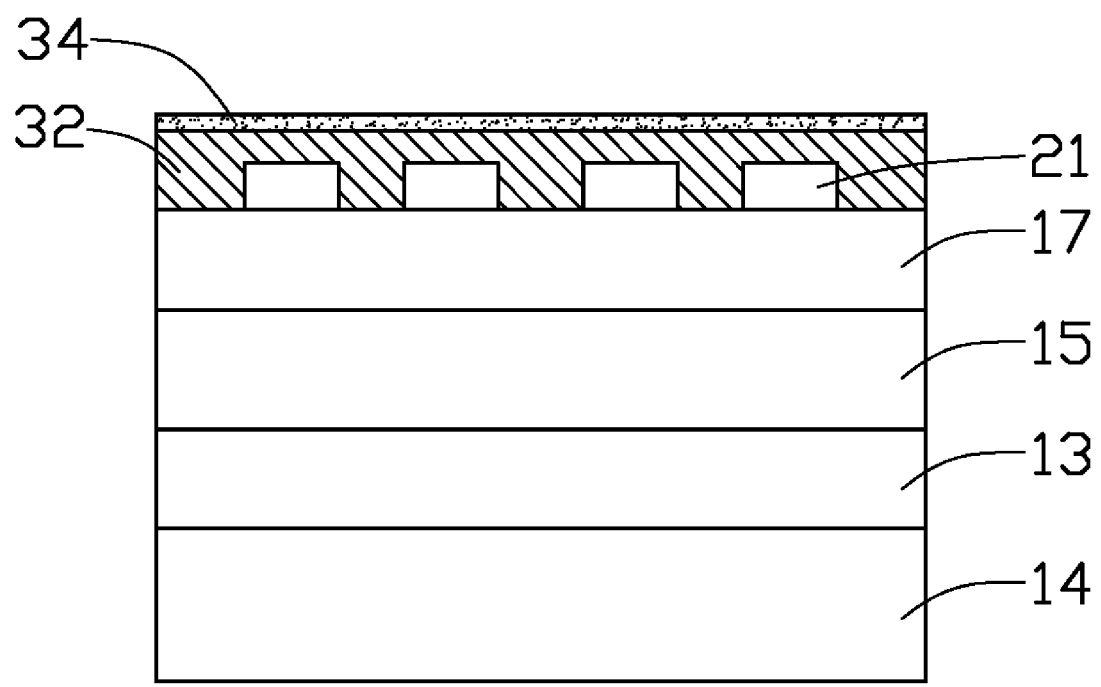
FIG. 3 shows a first semiconductor structure which is obtained from spreading a metallic reflecting layer on the p-type AlGaInP cladding layer of the epitaxy structure and the point-like ohmic electrodes, and spreading a first adhesive layer on the metallic reflecting layer.

Referring to FIG. 3, a metallic reflecting layer 32 and a first adhesive layer 34 are sequentially spread on the epitaxy structure 10, and a first semiconductor structure 30 is obtained. The metallic reflecting layer 32 is spread on and contacts the p-type AlGaInP cladding layer 17 of the epitaxy structure 10. The first adhesive layer 34 is spread on and contacts the metallic reflecting layer 32. The metallic reflecting layer 32 fills spaces between and around the point-like ohmic electrodes 21. The metallic reflecting layer 32 includes metal with high reflectivity, such as aluminum, silver, or etc. The first adhesive layer 34 is preferably selected from a group consisting of silver (Ag), gold (Au), tin (Sn), gold tin (AuSn), lead tin (PbSn), indium (In), indium palladium (InPd), and indium tin oxide (ITO).

Figure 4:
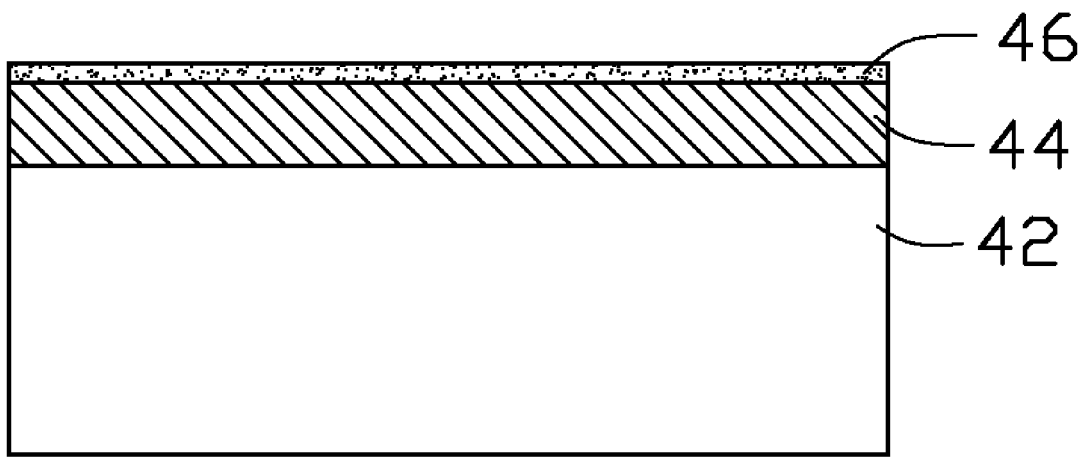
FIG. 4 shows a second semiconductor structure which includes a carrier substrate, an ohmic contact layer on the carrier substrate, and a second adhesive layer on the ohmic contact layer.

Referring to FIG. 4, a second semiconductor structure 40 is provided. The second semiconductor structure 40 includes a carrier substrate 42, an ohmic contact layer 44 formed on the carrier substrate 42, and a second adhesive layer 46 formed on the ohmic contact layer 44. Optimally, a material of the carrier substrate 42 is selected from silicon (Si), silicon carbide (SiC), and a group III-V compound material.

Figure 5:
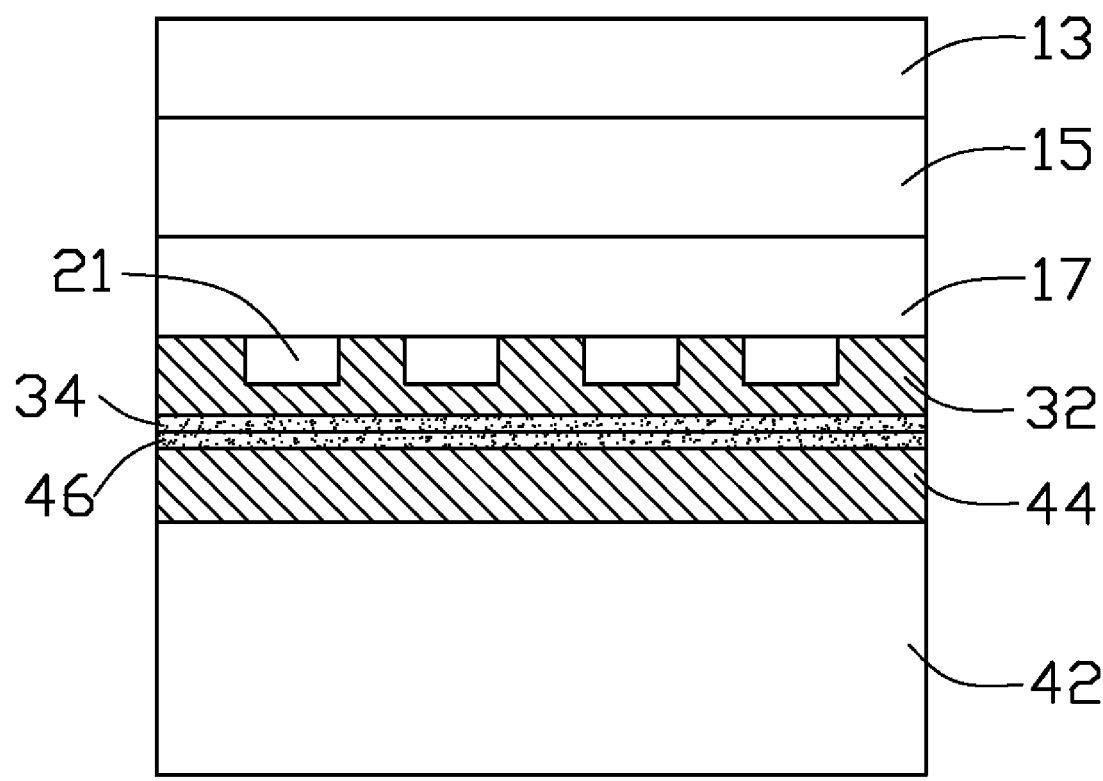
FIG. 5 shows a light-emitting diode chip which is obtained from bonding the first and the second semiconductor structures together and removing the GaAs substrate from the first semiconductor structure.

Referring to FIG. 5, the first semiconductor structure 30 is bonded to the second semiconductor structure 40, and the GaAs substrate 14 is removed from the first semiconductor structure 30, and a light-emitting diode chip 50 is obtained. The first semiconductor structure 30 is bonded to the second semiconductor structure 40 via wafer bonding technique. The GaAs substrate 14 is removed from the first semiconductor structure 30 via grinding or selective etching method.

Referring to FIG. 6, a transparent conducting layer 62 is formed on the n-type AlGaInP cladding layer 13 of the light-emitting diode chip 50. Preferably, the transparent conducting layer 62 ohmic contacts with the n-type AlGaInP cladding layer 13 of the light-emitting diode chip 50. A material of the transparent conducting layer 62 can be selected from tin monoxide (SnO), indium-doped tin monoxide (SnO:In), antimony-doped tin dioxide ($SnO_2$:Sb), zinc-doped indium oxide ($In_2O_3$:Zn), tin-doped indium silver oxide ($AgInO_2$:Sn), indium tin oxide (ITO), zinc oxide (ZnO), aluminum-doped zinc oxide (ZnO:Al), zinc gallium oxide ($ZnGa_2O_4$), tin-doped gallium oxide ($Ga_2O_3$:Sn), etc.

Referring to FIG. 7, a first electrical contact 72 is formed on the transparent conducting layer 62, and a second electrical contact 74 is formed on a bottom surface of the carrier substrate 42. Accordingly, the light emitting diode 70 is obtained.

In the present light emitting diode 70, the first and the second semiconductor structures 30, 40 are bonded together by bonding force generated between the first adhesive layer 34 of the first semiconductor structure 30 and the second adhesive layer 46 of the second semiconductor structure 40. Therefore, there in no need to co-heat the first and the second semiconductor structures 30, 40 in a high temperature for a long time for bonding the first and the second semiconductor structures 30, 40 together. Thus, the present light emitting diode 70 has better light emitting capability and higher qualifying rate than the related LED of U.S. Pat. No. 5,869,849. Moreover, the transparent conducting layer 62 ohmic contacts with the n-type AlGaInP cladding layer 13 of the light emitting diode 70. Therefore, there is no need for an additional secondary epitaxial growth step in the manufacturing of the present light emitting diode 70 and the manufacturing process of the present light emitting diode 70 is simplified and the manufacturing cost of the present light emitting diode 70 is decreased.

In the manufacturing process of the present light emitting diode 70, the metallic reflecting layer 32 shown in FIG. 3 can be omitted, which allows the ohmic electrodes 21 to directly contact with the first adhesive layer 34. The transparent conducting layer 62 shown in FIG. 7 can also be omitted and the first electrical contact 72 is directly formed on the n-type AlGaInP cladding layer 13.

Figure 8:
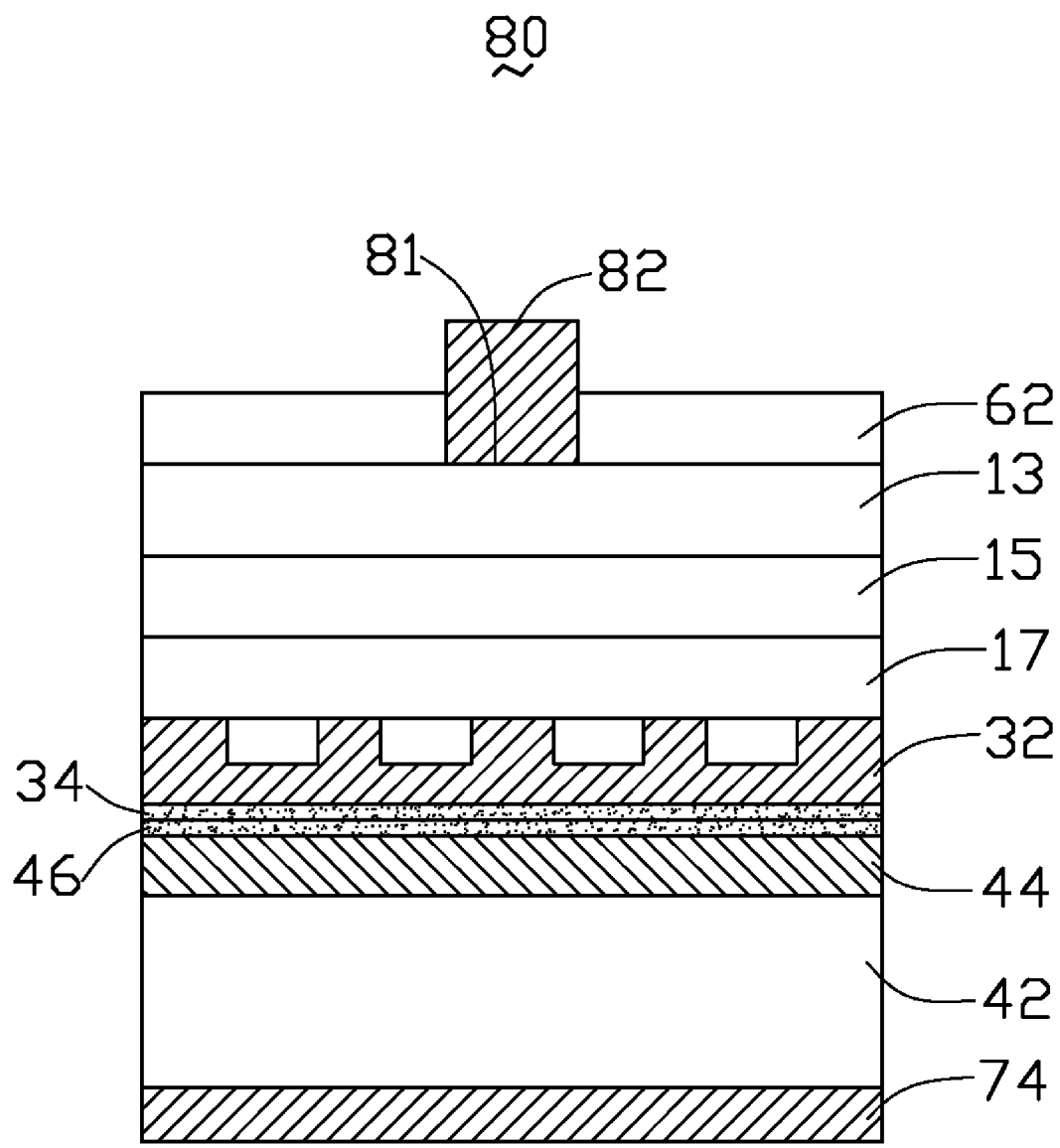
FIG. 8 is a transverse sectional view of a light emitting diode according to a second embodiment of the present invention.
Figure 9:
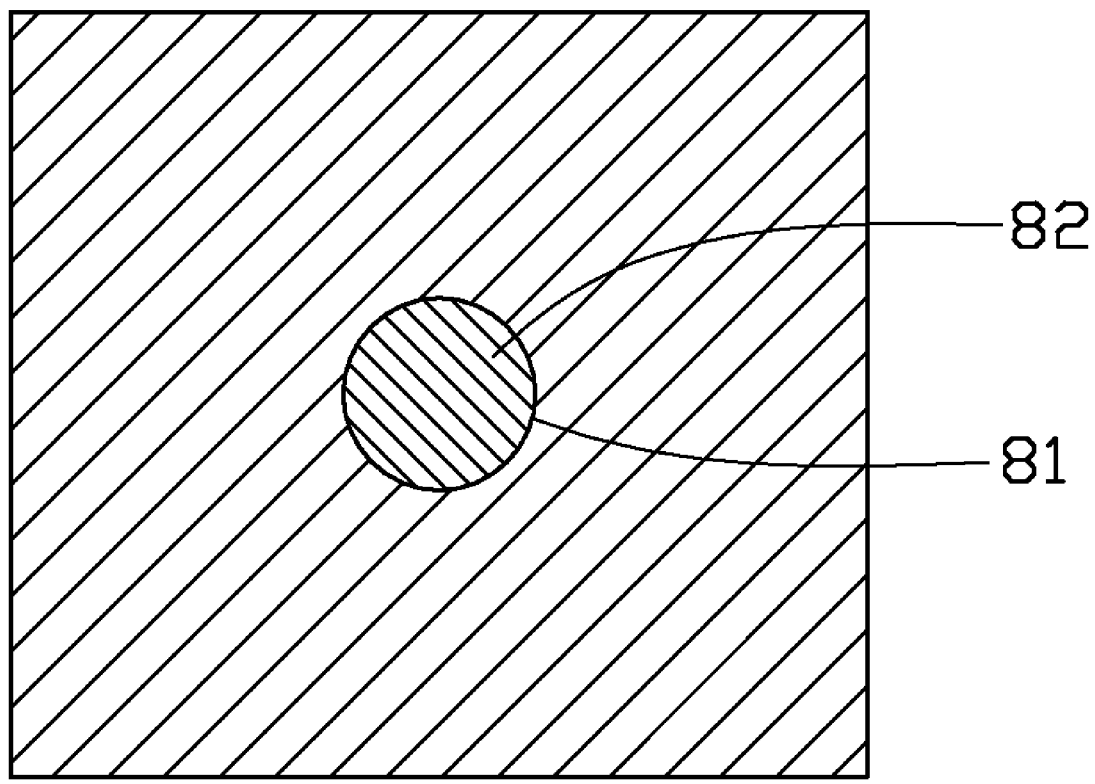
FIG. 9 is a top view of the light emitting diode of FIG. 8.

Referring to FIGS. 8 and 9, a second embodiment of the present light emitting diode 80 is shown. In the second embodiment, a round receiving hole 81 is etched through the transparent conducting layer 62 and a first electrical contact 82 is formed in the receiving hole 81 of the transparent conducting layer 62. The first electrical contact 82 has a top end extending upwardly above a top surface of the transparent conducting layer 62, and a bottom end contacting with a top surface of the n-type AlGaInP cladding layer 13. In the second embodiment, the first electrical contact 82 is formed in the receiving hole 81 of the transparent conducting layer 62 which induces the first electrical contact 82 to intimately contact with the transparent conducting layer 62.

Figure 10:
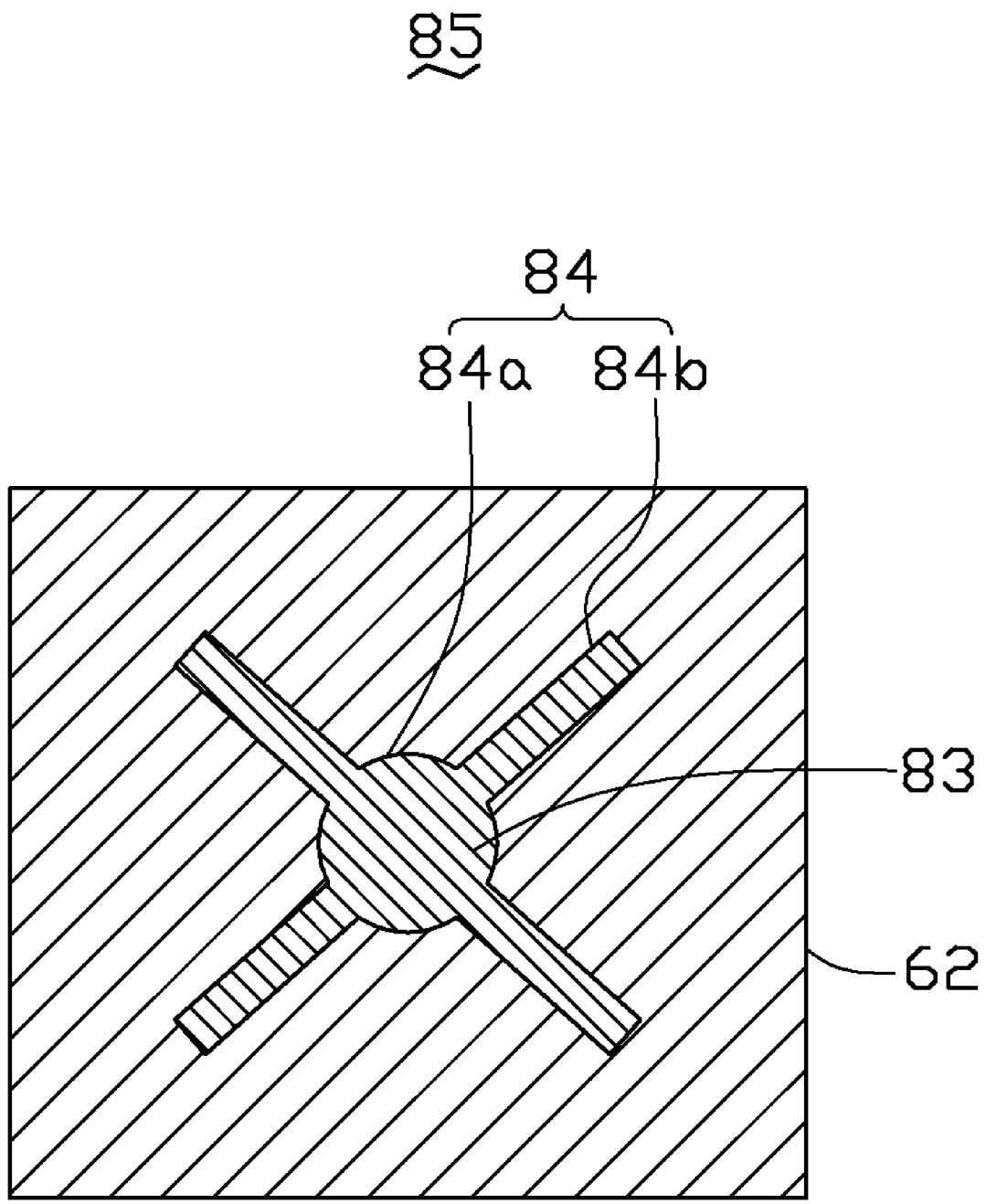
FIG. 10 is a top view of a light emitting diode according to a third embodiment of the present invention.

Referring to FIG. 10, a third embodiment of the present light emitting diode 85 is shown. In the third embodiment, configurations of the receiving hole 84 and the first electrical contact 83 are different from configurations of the receiving hole 81 and the first electrical contact 82 of the second embodiment. In the third embodiment, the receiving hole 84 includes a round center portion 84a and a plurality of finger portions 84b radially extending outwardly from the round center portion 84a. Therefore, the first electrical contact 83 includes a plurality of finger portions extending outwardly toward an outer edge of the transparent conducting layer 62.

Thus, electric current can be dispersed over the light emitting diode 85 via the finger portions of the first electrical contact 83.

Figure 11:
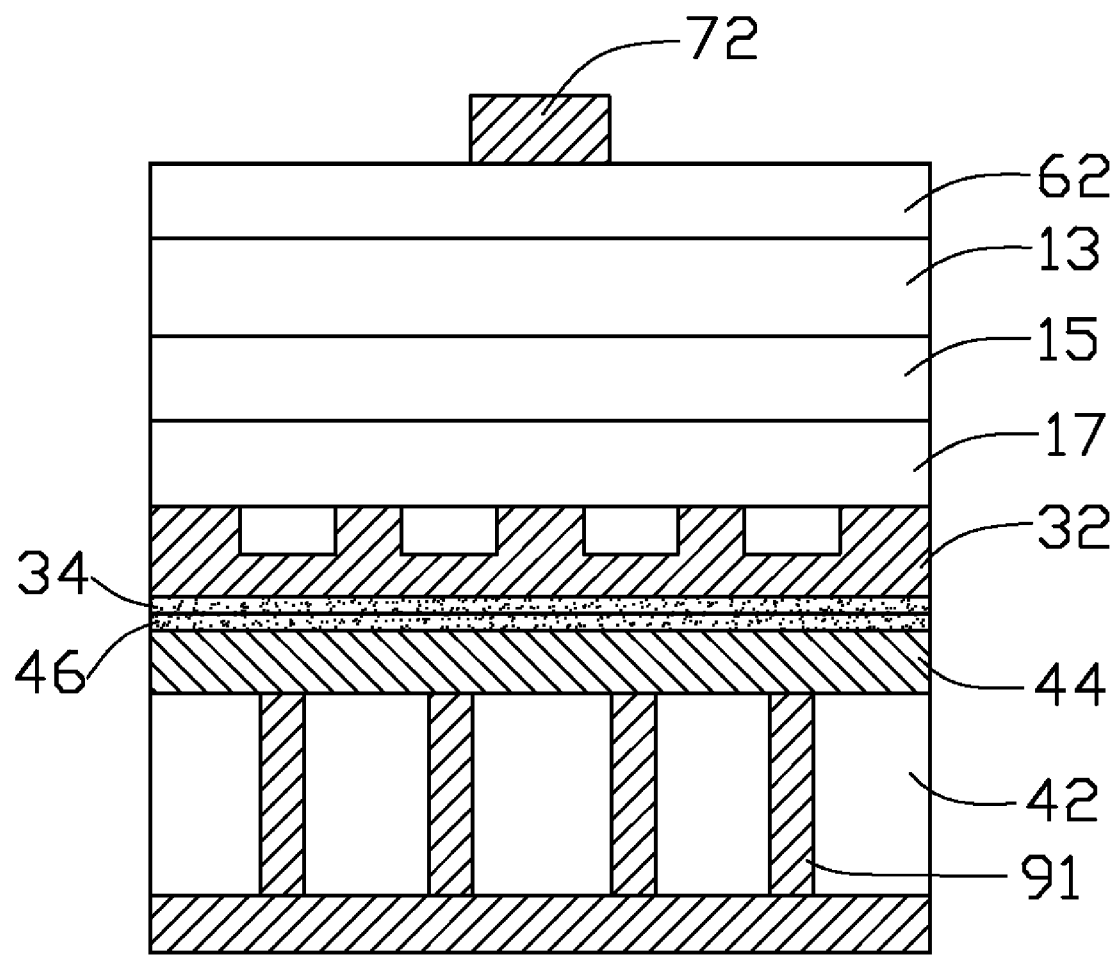
FIG. 11 is a transverse sectional view of a light emitting diode according to a fourth embodiment of the present invention.

Referring to FIG. 11, a fourth embodiment of the present light emitting diode 92 is shown. In the fourth embodiment, the carrier substrate 42 is different from the carrier substrate 42 of the first embodiment. The carrier substrate 42 of the fourth embodiment is made of ceramic material which has a good thermal conductivity. A plurality of through holes 91 are defined in the carrier substrate 42 for filling electrically conductive material therein. Electric current can flow through the carrier substrate 42 through the electrically conductive material. Therefore, the ceramic carrier substrate 42 induces the present light emitting diode 92 has good heat dissipation capability.

Figure 12:
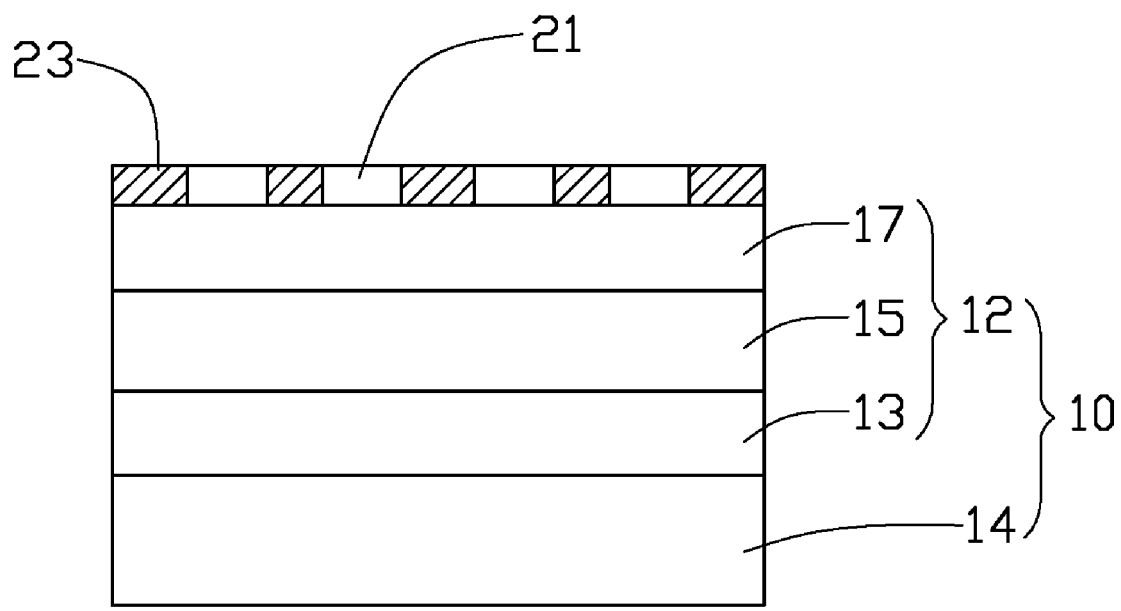
FIG. 12 is a transverse sectional view of an epitaxy structure of a light emitting diode according to a fifth embodiment of the present invention.
Figure 13:
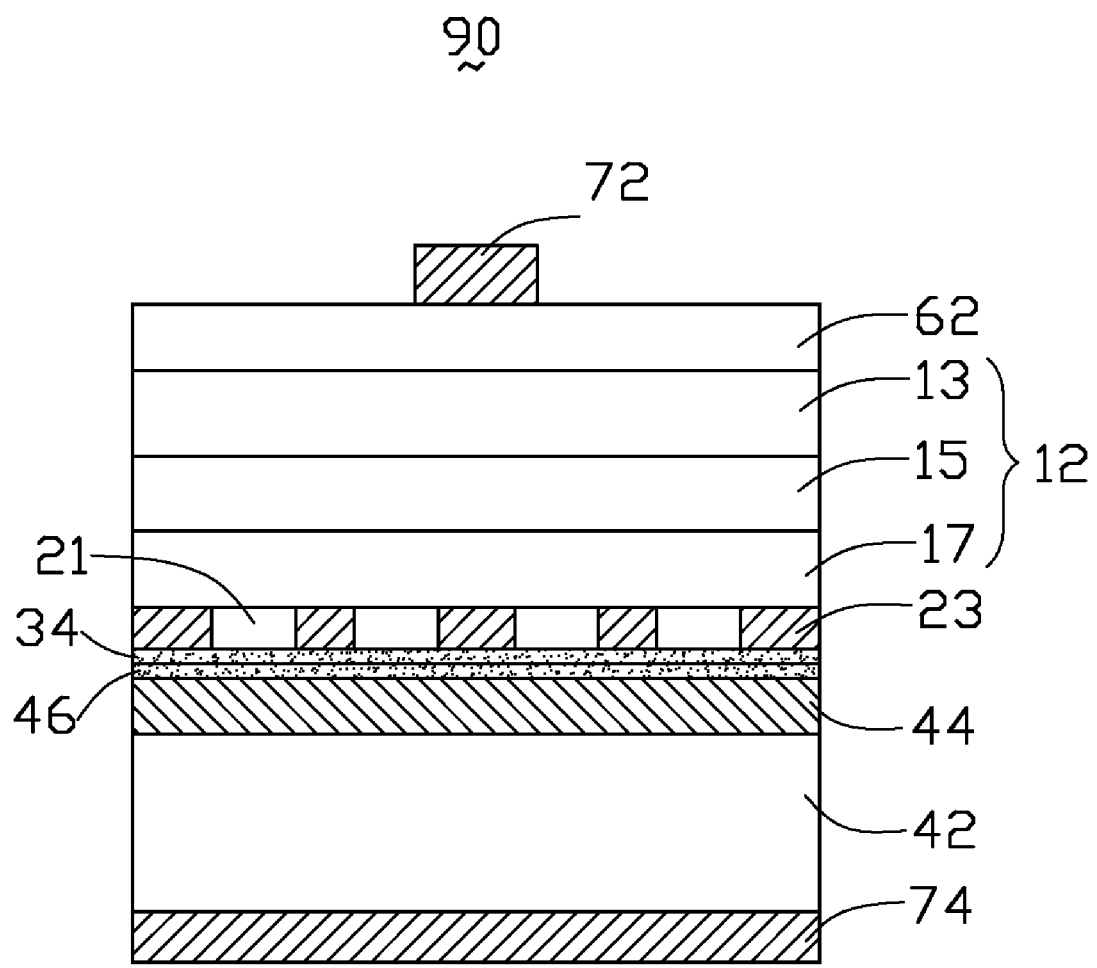
FIG. 13 is a transverse sectional view of the light emitting diode according to the fifth embodiment of the present invention.

Referring to FIGS. 12 and 13, a fifth embodiment of the present light emitting diode 90 is shown. The difference between the fifth embodiment and the first embodiment is: a Bragg reflecting layer 23 is spread on the epitaxy structure 10 of FIG. 1, and a plurality of receiving apertures are etched through the Bragg reflecting layer for forming the point-like ohmic electrodes 21 therein. The first adhesive layer 34 is then formed on the Bragg reflecting layer 23 and the light emitting diode 90 of the fifth embodiment is manufactured according to the steps shown in the first embodiment. The Bragg reflecting layer 23 of the fifth embodiment has better reflectivity than the metallic reflecting layer 32 of the first embodiment. Therefore, the light emitting diode 90 of the fifth embodiment has better reflectivity than the light emitting diode 70 of the first embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode comprising:
   a first semiconductor structure comprising:
      a double hetero-structure comprising an n-type AlGaInP cladding layer, a p-type AlGaInP cladding layer, and an AlGaInP active layer sandwiched between the n-type AlGaInP cladding layer and the p-type AlGaInP cladding layer;
      a transparent conducting layer formed on and in ohmic contact with the n-type AlGaInP cladding layer;
      a first electrical contact in contact with the transparent conducting layer;
      a plurality of ohmic electrodes in ohmic contact with the p-type AlGaInP cladding layer; and
      a reflecting layer formed on an opposite side of the p-type AlGaInP cladding layer to the AlGaInP active layer;
   a second semiconductor structure comprising:
      a carrier substrate;
      an ohmic contact layer formed on the carrier substrate; and
      a second electrical contact formed on an opposite side of the carrier substrate to the ohmic contact layer; and
      an adhesive layer sandwiched between the reflecting layer of the first semiconductor structure and the ohmic contact layer of the second semiconductor structure.

2. The light emitting diode of claim 1, wherein the first electrical contact is formed on a top surface of the transparent conducting layer.

3. The light emitting diode of claim 2, wherein the transparent conducting layer defines a receiving hole therethrough, the first electrical contact extending through the receiving hole of the transparent conducting layer and in contact with the n-type AlGaInP cladding layer.

4. The light emitting diode of claim 3, wherein the receiving hole comprises a center portion and a plurality of finger portions radially and outwardly extending from the center portion.

5. The light emitting diode of claim 1, wherein a material of the transparent conducting layer is selected from the group consisting of tin monoxide, indium-doped tin monoxide, antimony-doped tin dioxide, zinc-doped indium oxide, tin-doped indium silver oxide, indium tin oxide, zinc oxide, aluminum-doped zinc oxide, zinc gallium oxide, and tin-doped gallium oxide.

6. The light emitting diode of claim 1, wherein the reflecting layer is a metallic reflecting layer which embeds the ohmic electrodes therein.

7. The light emitting diode of claim 1, wherein the reflecting layer is a Bragg reflecting layer which defines a plurality of receiving apertures therethrough receiving the ohmic electrodes therein.

8. The light emitting diode of claim 1, wherein the adhesive layer is comprised of a material selected from the group consisting of silver, gold, tin, gold tin, lead tin, indium, indium palladium, and indium tin oxide.

9. The light emitting diode of claim 1, wherein a material of the carrier substrate is selected from the group consisting of silicon, silicon carbide, and a group III-V compound material.

10. The light emitting diode of claim 1, wherein the carrier substrate is made of ceramic material, a plurality of through holes being defined in the substrate with electrically conductive material filled therein.

\* \* \* \* \*